(12) United States Patent
Zhao et al.

(10) Patent No.: US 6,852,990 B1
(45) Date of Patent: Feb. 8, 2005

(54) ELECTROSTATIC DISCHARGE DEPOLARIZATION USING HIGH DENSITY PLASMA

(75) Inventors: Zhiyong Zhao, Austin, TX (US); David Hendrix, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 187 days.

(21) Appl. No.: 09/896,381

(22) Filed: Jun. 29, 2001

(51) Int. Cl.⁷ ................................................ H01J 61/00
(52) U.S. Cl. ........................ 250/492.2; 250/492.3; 361/212; 361/213
(58) Field of Search .................. 361/212, 213; 250/492.2, 492.21, 492.3; 118/722, 723 R, 723 FE, 723 FI

(56) References Cited

U.S. PATENT DOCUMENTS

| | | | |
|---|---|---|---|
| 4,825,087 A | | 4/1989 | Renau et al. ............ 250/492.2 |
| 5,089,710 A | * | 2/1992 | Kikuchi et al. .......... 250/492.3 |
| 5,399,871 A | * | 3/1995 | Ito et al. ................ 250/492.21 |
| 5,545,257 A | * | 8/1996 | Vella ....................... 118/723 R |
| 5,900,062 A | * | 5/1999 | Loewenhardt et al. ... 118/723 R |
| 6,271,529 B1 | * | 8/2001 | Farley et al. ........... 250/492.21 |
| 6,452,197 B1 | * | 9/2002 | Ito ........................ 250/492.21 |

FOREIGN PATENT DOCUMENTS

| | | | | |
|---|---|---|---|---|
| JP | 6-119903 | * | 4/1994 | .......... H01J/37/317 |
| JP | 6-120140 | * | 4/1994 | .......... H01L/21/203 |
| JP | 8-167595 | * | 6/1996 | .......... H01L/21/205 |
| JP | 09-186229 | * | 7/1997 | .......... H01L/21/68 |
| JP | 11-238486 | * | 8/1999 | .......... H01J/37/317 |
| WO | WO 99/66549 | * | 12/1999 | .......... H01L/21/68 |

* cited by examiner

Primary Examiner—Huan Tran
(74) Attorney, Agent, or Firm—Winstead Sechrest & Minick P.C.

(57) ABSTRACT

A method for electrostatic discharge depolarization is implemented. The buildup of charge on tool structures in fabrication tools for semiconductor processing may be expected to be of concern whenever high voltage is employed near the structure in a tool. The process herein includes selectively exposing the structure to a plasma for a selected time interval. The duration of the exposure time interval is sufficient to reduce the polarization of the structure whereby the forces due to the polarization do not interfere with the transport or movement of a wafer being processed.

18 Claims, 2 Drawing Sheets

ELECTROSTATIC DISCHARGE DEPOLARIZATION USING HIGH DENSITY PLASMA

TECHNICAL FIELD

The present invention relates in general to semiconductor fabrication tools, and in particular, to the discharge of electrostatic charge buildup on the wafer pad or other structure in the process chambers of fabrication tools.

BACKGROUND INFORMATION

Electrostatic discharge (ESD) control measures are typically employed in fabrication facilities for semiconductor devices. These control strategies are typically employed in the fabrication facilities external to the tools, however, currently, there are no generally applied protocols for neutralizing the buildup of electrical charges within the vacuum regions of the tools themselves.

The buildup of charge on tool structures may be expected to be of concern whenever high voltage is employed near a wafer pad in a tool. For example, ion implants are used to introduce dopants into the underlying semiconductor material to produce the structural elements of the transistors constituting the integrated circuit device being fabricated. Shallow junction formation requires implants at relatively low beam energies, on the order of 0.2 to 5 kilo electron volts (keV). To compensate for divergence of the ion beams due to space charge effect, an electrostatic focusing lens may be employed, which lens may be deployed close to the pad supporting the wafer during the implantation.

Additionally, the wafer being fabricated may be supported on a pad formed from an insulating material. These feature sizes of the transistors and associated interconnect forming the circuitry of the integrated circuit device have become smaller, the components of the tool have evolved accordingly. Thus, insulating materials, for example, alumina or elastomeric polymers may be used to support the wafers to prevent scratching, as well as reduce particulate contamination. Also, electrostatic clamping has supplanted mechanical clamping for similar reasons and such pads are suitable use with this clamping mechanism.

Exposure of the insulating pad to high voltages from, for example, focusing lens in proximity thereto, may induce long term electrostatic polarization on the pad. As the pad becomes electrically polarized, which may bear a surface voltage on the order of 10 kilo volts, an undesirable adhesion of the wafer to the pad may be observed. In extreme cases, the electrostatic bonding of the wafer to the pad may be large enough that the forces required to lift the wafer from the pad produce stresses in the wafer sufficient to break the wafer. An early manifestation of the polarization of the pad, before the polarization has reached the extreme values where the integrity of the wafer is jeopardized, is misalignment of the wafer on the pad. During the wafer loading process, the electrostatic forces between the wafer and the pad may result in an observable misalignment of the wafer and pad since the wafer cannot slide freely on the pad. The misalignment is detected by the wafer handling equipment and processing of the wafers cannot be performed under these circumstances. Retrieving the misaligned wafer is usually time consuming since it has to be removed manually from the pad.

In the case when the charging-up is found at the end of the implant, the wafer cannot be lifted up by the wafer lift pins due to the electrostatic force between the pad and the wafer in the wafer unloading process. The wafer remains adhered to the pad until the force exerted by the lift pins exceeds the polarization force adhering the wafer to the pad, at which time, the wafer abruptly separates from the pad. In such cases, the wafer may be popped up from the wafer pad causing it to be offset from its normal position and the wafer transportation mechanism cannot retrieve the wafer automatically. Manual intervention is then required to remove the wafer from the wafer pad.

In either cases, the product wafer is at risk of breakage and production time wasted. Thus, the polarization does not need to rise to the levels where the integrity of the wafer is jeopardized before deleterious affects on the throughput of the device fabrication process occur.

Consequently, there is a need in the art for techniques to control the buildup of electrostatic charge, and the concomitant ESD, in a fabrication tool, and in particular, in ion implantation tools in which structures, for example, focusing lenses, are operated in proximity to the pads supporting the wafers being fabricated.

SUMMARY OF THE INVENTION

The aforementioned needs are addressed by the present invention. Accordingly a method for reducing electrostatic discharge (ESD) by depolarization of a polarized portion of a fabrication tool of is provided. The method includes the step of selectively exposing the portion of a fabrication tool to a plasma for a selected time interval. The duration of the exposure time interval is sufficient to reduce the polarization of the tool portion whereby interference with a motion of a device being processed by the tool is not observed.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
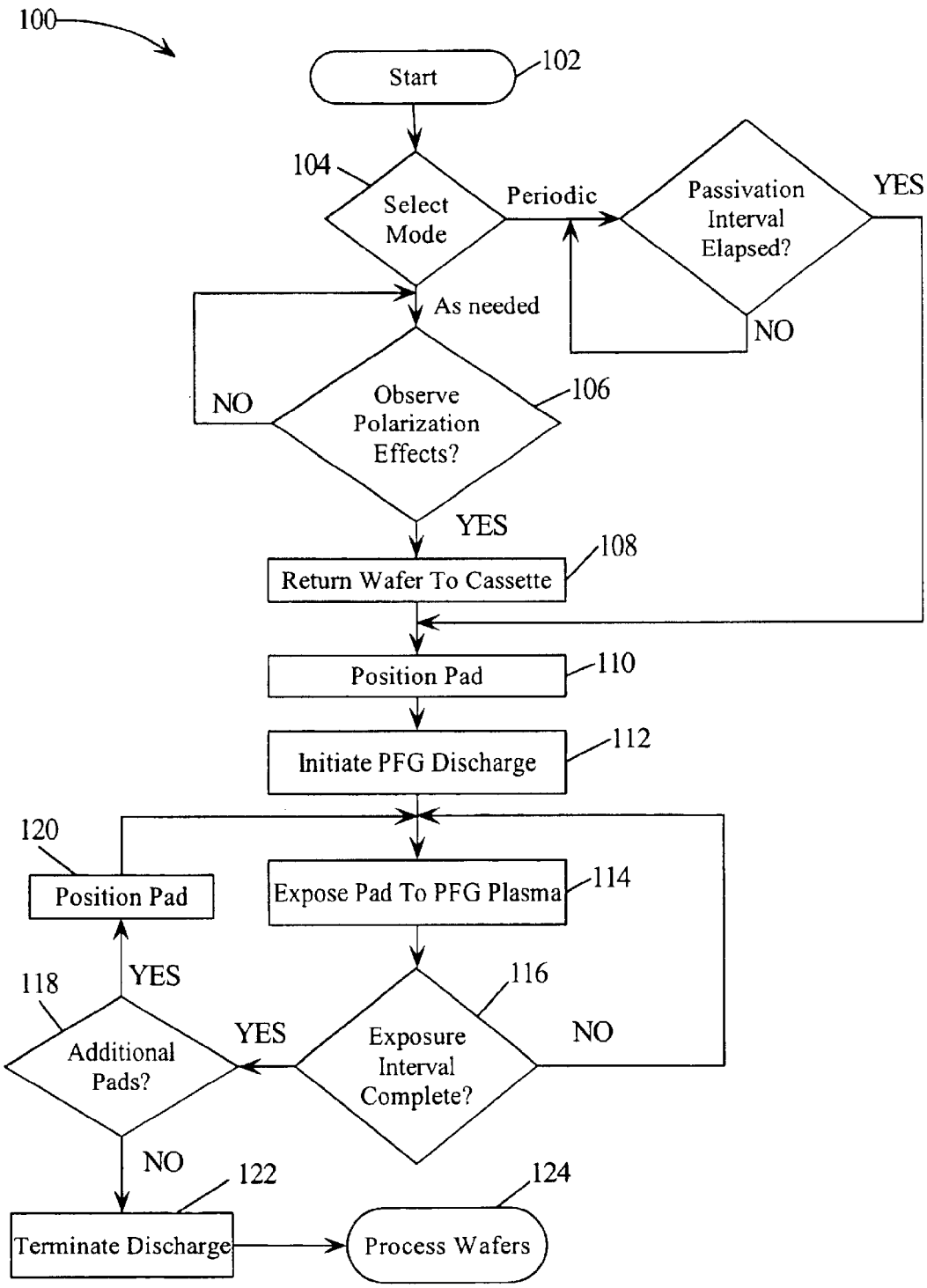
FIG. 1 illustrates, in flow chart form, a methodology for controlling electrostatic discharge (ESD) in a fabrication tool in accordance with an embodiment of the present invention.

The present invention provides a mechanism for controlling a polarization of structures within a wafer fabrication tool. A high density plasma is generated within the vacuum volume of the tool, and the plasma is injected into the tool in the vicinity of structures susceptible to the buildup of polarization charges. Exposure of the structures to the plasma for a preselected interval of time relaxes the polarization.

In the following description, numerous specific details are set forth such as specific arc currents and voltages, and gas flow rates, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Referring first to FIG. 1, there is illustrated therein a flow chart of process 100 in accordance with the principles of the present invention. Process 100 starts in step 102, and in step 104 a depolarization mode is selected. A pad (or multiple pads) if used in the particular tool or other polarized structure to be depolarized, may be depolarized at predetermined intervals, essentially as a preventive measure, or alternatively, pads, or other polarized structures, may be depolarized as needed, that is, when the polarization rises to a level sufficient to affect the operation of the tool, as described further hereinbelow.

Figure 2:
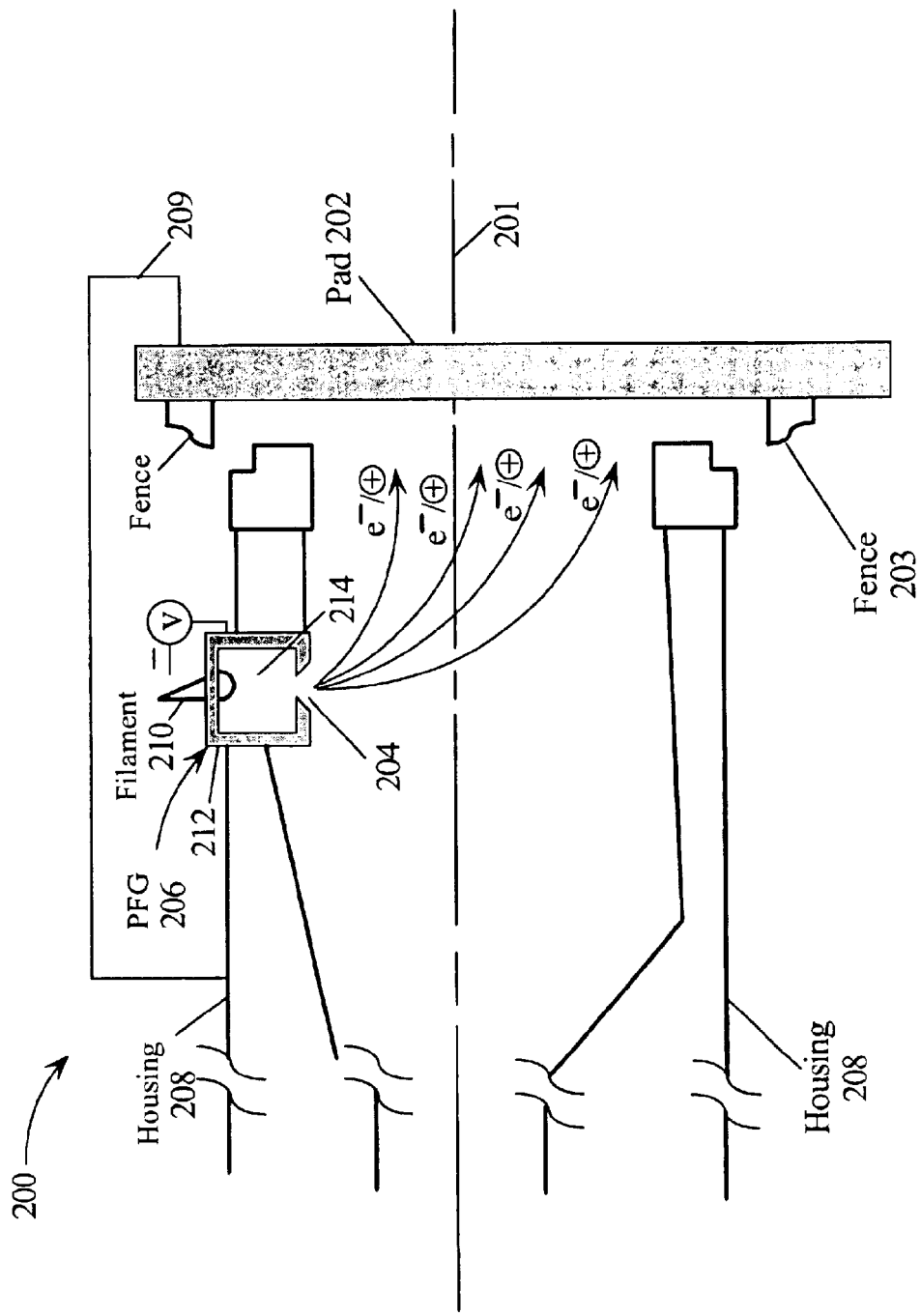
FIG. 2 schematically illustrates a portion of a fabrication tool which may be used with the methodology of FIG. 1.

Consider first, process 100 in accordance with the principles of the present invention if the selected mode is to depolarize the pads as needed. In step 106, it is determined if polarization affects are observed. Indications that the polarization of the pad has grown to levels at which depolarization of the pad is needed may be detected in the interference with the wafer handling mechanics by electrical (principally electrostatic) forces between the wafers and the polarized pad. These electrostatic forces may be observed to interfere with the location of the wafer on the pad, or, alternatively, in the observation of abnormally high forces necessary to lift the wafer from the pad to return the wafer to a wafer cassette or tray. One manifestation of the polarization of the pad may be a resistance to the movement (sliding) of the wafer across the pad, which may result in misalignment of the wafer with respect to the pad. In extreme cases, the forces necessary to lift the wafer from the pad may be sufficiently large so as to result in cracking of the wafer. Any observed interference with the transport or movement of the wafer, including resistance to the lifting of the wafer from the pad will, for simplicity, be generically be referred to as "sticking." If such polarization affects are observed, in step 108, the wafer is returned to the wafer cassette, or tray, or similar device for holding and transferring wafers between fabrication stages. In step 110, the pad to be depolarized is positioned in proximity to a plasma flood gun (PFG). This may be further understood by referring to FIG. 2 illustrating a portion 200 of a wafer fabrication tool. (It would be recognized by those of ordinary skill in the art that portion 200 may be enclosed in a vacuum region of the fabrication tool. The enclosing vacuum chamber is omitted from FIG. 2 for simplicity.) Such tools may include, by way of example, ion implanters, physical vapor deposition tools, plasma immersion implantation tools and chemical vapor deposition tools. However, the principles of the present inventive process may be applied to any fabrication tool in which polarization of a wafer support structure is observed, for example, due to the presence of high voltages next to the pad and wafer. Pad 202 may have fence 203 attached thereto. Fence 203 may serve as a wafer alignment mechanism, and the polarization effects discussed above may appear in the wafer not sliding against the fence. In FIG. 2, pad 202 is positioned in proximity to aperture 204 in PFG 206 which may be installed in housing 208 of portion 200. (Note that housing 208, pad 202 and fence 203 may be axially symmetric about central axis 201.) In an embodiment of the present invention, pad 202 may be positioned with a perpendicular distance in the range of 127 mm to 152.4 mm (5 inches to 6 inches), however, as those of ordinary skill in the art would appreciate, the principles of the present invention may be practiced with other distances and such embodiment would be within the principles of the present invention. PFG 206 may be a commercial device supplied with the tool, such as the PFG incorporated in the VIISion™ 80 and VIISion™ 200 ion implanters manufactured by Varian Ion Implant Systems, Gloucester, Mass.

Returning to FIG. 1, in step 108 the PFG discharge is initiated. PFG 206, FIG. 2, may include a hot cathode arc discharge struck between a hot cathode formed by filament 210 to which an arc voltage, V, is applied, and body 212 of PFG 206. The arc voltage applied to hot cathode filament 210 may be negative with respect to body 212. Note that body 212 and housing 208 are at the same potential. (It would be appreciated by those of ordinary skill that filament 210 is insulated from housing 212.) Additionally, pad 202 may be electrically connected to housing 208 (whereby a circuit for the depolarizing current flow is completed) schematically depicted by path 209. One of ordinary of ordinary skill in the art would appreciate that the conducting path may be provided by support members for pad 202 which have not been shown in FIG. 2. In an embodiment of the present invention, the arc voltage, V, may be in the range often volts to thirty volts (10 V to 30 V), for example, eighteen volts (18 V). Those of ordinary skill would recognize that the voltage range is exemplary and that other voltages may be used with the present inventive principles and such embodiments would fall within the spirit and scope of the present invention. The arc may be struck in a noble gas suppled to interior volume 214 of PFG 206. A noble gas such as argon or xenon may be used, however, it would be recognized by those of ordinary skill in the art that other noble gases, or combinations thereof may be used as well, and such embodiments would fall within the spirit and scope of the present invention. (The gas supply is not shown in FIG. 2 for simplicity.) In the arc discharge, the gas supplied to interior volume 214 is ionized to produce a plasma which flows out of interior volume 214 via aperture 204. In an embodiment of the present invention, xenon gas may be supplied to the interior volume of 214 of PFG 206 at a rate of 1.3 standard cubic centimeters per minute (sccm). ("Standard" refers to standard conditions which would be understood by those of ordinary skill in the art to refer to 760 torr pressure and 20° C. temperature.) The arc discharge current in this exemplary embodiment may be five amperes (5 A). Those of ordinary skill in the art would recognize that the principles of the present invention may be practiced with other gas flow rates and arc currents to produce a plasma for passivating the electrostatic polarization, and such embodiments would be within the spirit and scope of the present invention.

Returning to FIG. 1, in step 114, the pad, such as pad 202, FIG. 2, is exposed to the PFG plasma. This is schematically illustrated in FIG. 2 by the paths labeled "e/⊕". (The plasma contains electrons and positive ions and the species that neutralizes the polarization depends on the polarity of the polarization. Thus, electrons may be drawn toward the pad if the polarization is positive, and conversely ions may be drawn toward the pad if the polarization is negative.) The pad may be exposed to the PFG plasma for a selected interval of time. The selected interval of time may have a duration sufficient to reduce the polarization of the pad whereby sticking is no longer observed. In step 116, the exposure continues until the preselected interval elapses. In an embodiment of the present invention, exposure may be in the range of five to ten minutes, however, alternative embodiments in which the exposure duration has other values, or other ranges of values, would fall within the spirit and scope of the present invention.

A tool may have multiple wafer pads, and, if, in step 118, there are additional pads to be depolarized, in step 120 a next pad is positioned in proximity to the PFG. Alternatively, in a tool having a plurality of pads disposed about a disk support structure, the entire set of pads may be depolarized by spinning the disk in proximity to the PFG. Exposure of the next pad then proceeds as previously discussed. If, in step 118, there are no additional pads to be depolarized, the discharge is terminated, step 122. Wafer processing may then proceed, step 124, in accordance with the particular fabrication process for the tool.

Although the present invention and its advantages have been described in detail, it should be understood that various changes, substitutions and alterations can be made herein without departing from the spirit and scope of the invention as defined by the appended claims.

What is claimed is:

1. A depolarization method comprising the step of selectively exposing a portion of a fabrication tool to a plasma for a selected time interval wherein said selected time interval has a duration sufficient to reduce a polarization of said portion of said fabrication tool whereby interference with a motion of a device being processed by said fabrication tool is not observed, wherein said step of selectively exposing said portion of said fabrication tool includes selecting for exposing said portion of said fabrication tool at preselected intervals of time, and exposing said portion if interference with said motion of said device is observed.

2. The method of claim 1 further comprising the step of detecting said interference with said motion of said device.

3. The method of claim 2 wherein said step of detecting said interference with said motion comprises step of detecting a misalignment of said device with respect to said portion of said fabrication tool.

4. The method of claim 1 wherein said portion of said fabrication tool comprises an insulating pad.

5. The method of claim 1 wherein said plasma comprises a plasma formed from a noble gas.

6. The method of claim 5 wherein said noble gas is selected from the group consisting of xenon and argon.

7. The method of claim 1 further comprising the step of generating said plasma with a plasma flood gun.

8. The method of claim 7 wherein said plasma flood gun includes an arc discharge.

9. The method of claim 8 wherein said arc discharge is struck between a hot filament cathode and an anode.

10. The method of claim 7 wherein said step of exposing said portion of said fabrication tool comprises the step of positioning said portion of said fabrication tool in proximity to an aperture of said plasma flood gun.

11. The method of claim 1 wherein said preselected time interval is preselected from the range of five to ten minutes.

12. A depolarization method comprising the steps of:
selectively exposing a portion of a fabrication tool to a plasma for a selected time interval wherein said selected time interval has a duration sufficient to reduce a polarization of said portion of said fabrication tool whereby interference with a motion of a device being processed by said fabrication tool is not observed; and
generating said plasma with a plasma flood gun, wherein said plasma flood gun includes an arc discharge, wherein said arc discharge is struck between a hot filament cathode and an anode, wherein said arc discharge has a voltage drop between said cathode and said anode of between ten and thirty volts.

13. A depolarization method comprising:
selectively exposing a portion of a fabrication tool to a plasma for a selected time interval wherein said step of selectively exposing a said portion of said fabrication tool includes exposing said portion of said fabrication tool if interference with a motion of a device being processed in said fabrication tool is observed.

14. The method of claim 13 wherein said plasma comprises a plasma formed from a noble gas.

15. The method of claim 13 further comprising the step of generating said plasma with a plasma flood gun.

16. The method of claim 13 wherein said portion of said fabrication tool comprises an insulating pad.

17. The method of claim 13 wherein said interference with said motion of said device is indicated by a misalignment of said device with respect to said portion of said fabrication tool.

18. The method of claim 13 wherein said portion of said fabrication tool is in a vacuum region of said fabrication tool.

* * * * *